(12) United States Patent
Fukunaga (10) Patent No.: US 7,768,088 B2
(45) Date of Patent: Aug. 3, 2010

(54) SOLID-STATE IMAGING DEVICE THAT EFFICIENTLY GUIDES LIGHT TO A LIGHT-RECEIVING PART

(75) Inventor: Toshiaki Fukunaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 199 days.

(21) Appl. No.: 11/230,672

(22) Filed: Sep. 21, 2005

(65) Prior Publication Data

US 2006/0076636 A1    Apr. 13, 2006

(30) Foreign Application Priority Data

Sep. 24, 2004   (JP)   ............... 2004-278208

(51) Int. Cl.
*H01L 31/112* (2006.01)

(52) U.S. Cl. .................. 257/436; 257/432; 257/437; 257/440; 257/E27.13; 257/E27.133; 257/E27.134; 257/E31.121; 257/E31.122

(58) Field of Classification Search .......... 257/432, 257/436, 437, 440, E27.13, E27.134, E27.142, 257/E27.133, E31.121, E31.122
See application file for complete search history.

(56) References Cited

U.S. PATENT DOCUMENTS

| | | | |
|---|---|---|---|
| 5,479,049 A * | 12/1995 | Aoki et al. | 257/642 |
| 6,362,498 B2 * | 3/2002 | Abramovich | 257/233 |
| 6,365,237 B1 * | 4/2002 | Peake et al. | 427/585 |
| 6,605,850 B1 * | 8/2003 | Kochi et al. | 257/431 |
| 6,630,722 B1 * | 10/2003 | Aoki | 257/435 |
| 6,784,014 B2 * | 8/2004 | Tanigawa | 438/60 |
| 7,075,164 B2 * | 7/2006 | Uya | 257/431 |
| 2001/0006237 A1 * | 7/2001 | Abe | 257/215 |
| 2003/0063204 A1 * | 4/2003 | Suda | 348/272 |
| 2003/0210342 A1 * | 11/2003 | Parks et al. | 348/340 |
| 2004/0241893 A1 * | 12/2004 | Nishio et al. | 438/22 |
| 2005/0045975 A1 * | 3/2005 | Kondo et al. | 257/414 |

FOREIGN PATENT DOCUMENTS

| | | |
|---|---|---|
| JP | 7-45805 A | 2/1995 |
| JP | 8-139300 A | 5/1996 |
| JP | 2002-118245 A | 4/2002 |

* cited by examiner

*Primary Examiner*—Kenneth A Parker
*Assistant Examiner*—Jay C Kim
(74) *Attorney, Agent, or Firm*—Sughrue Mion, PLLC (57) ABSTRACT

In a solid-state imaging device including an on-chip microlens and a light-receiving part to receive incident light condensed by the on-chip microlens, an optical waveguide extending from an undersurface part of the microlens to the light-receiving part and for guiding the incident light condensed by the microlens to the light-receiving part is formed to be integrated with the microlens. By this, since the incident light condensed by the microlens is incident on the light-receiving part with little loss, the sensitivity is improved.

14 Claims, 10 Drawing Sheets

SOLID-STATE IMAGING DEVICE THAT EFFICIENTLY GUIDES LIGHT TO A LIGHT-RECEIVING PART

This application is based on Japanese Patent application JP 2004-278208, filed Sep. 24, 2004, the entire content of which is hereby incorporated by reference. This claim for priority benefit is being filed concurrently with the filing of this application.

BACKGROUND OF THE INVENTION

1. Technical Field of the Invention

The present invention relates to a solid-state imaging device in which a microlens for condensing light is provided above a light-receiving part, and particularly to a solid-state imaging device in which an optical waveguide is provided between a light receiving part and a microlens in order to efficiently guide light to the light-receiving part.

2. Description of the Related Art

An on-chip microlens is provided above a light-receiving part of a photodiode (photoelectric conversion device), and the film thickness of an intermediate layer between the photodiode and the microlens has been set so that the focal position thereof is located in the vicinity of the light-receiving part of the photodiode. However, as an increase in the number of pixels (improvement for higher pixel number) is advanced, the size of each pixel is reduced, and accordingly, an alignment shift between the aperture of the pixel and the microlens, or an optical path shift at a small F value (when the diaphragm is opened) has a significant influence on the sensitivity of the light-receiving part.

In the related art disclosed in JP-A-7-45805, JP-A-8-139300, and JP-A-2002-118245, an optical waveguide is provided between a planarizing layer provided below a microlens and a photodiode. Setting is made such that the focal position of incident light passing through the microlens is in the vicinity of an interface (light incidence plane of an optical waveguide) between the planarizing layer and the optical waveguide, and light is efficiently guided to the photodiode by the optical waveguide.

It is disclosed that consequently, the above problem is solved, and it becomes possible to design the microlens having a high degree of freedom and the planarizing layer.

However, in the above related art, since the microlens and the optical waveguide are provided to be spaced from each other through the planarizing layer, a loss occurs in the light incident on the light-receiving part, and there is a fear that the sensitivity is lowered. Besides, since the microlens is formed of a resin having a low refractive index, in the case where an imaging device is sealed, it is necessary to provide a space above the microlens, and besides, since glass is generally used for sealing, there is a problem that the thickness can not be reduced and the cost becomes high.

Besides, since the planarizing layer is provided between the microlens and the optical waveguide, there is a problem that in the case where materials of the microlens, the planarizing layer, and the optical waveguide are different from one another, manufacturing must be made such that the incident light is not scattered at the respective interfaces.

SUMMARY OF THE INVENTION

An object of the invention is to provide a highly sensitive solid-state imaging device in which the sensitivity of a light-receiving part is not reduced, the influence of an alignment shift or an optical path shift at a small F value or the like is reduced, and the incident light can be efficiently guided to the light-receiving part, and to provide a solid-state imaging device in which the thickness is thin and the cost is low. The object of the invention is achieved by the following invention:

(1). A solid-state imaging device, comprising:
an on-chip microlens;
a light-receiving part that receives incident light condensed by the on-chip microlens; and
an optical waveguide that extends from an undersurface part of the on-chip microlens to the light-receiving part, and guides the incident light condensed by the on-chip microlens to the light-receiving part, wherein the optical waveguide is integrated with the on-chip microlens.

(2). The solid-state imaging device according to (1), wherein a diameter of the optical waveguide is reduced toward the light-receiving part such that a part of the optical waveguide has one of a conical shape and a polygonal pyramid shape.

(3). The solid-state imaging device according to (1) or (2), wherein the on-chip microlens and the optical waveguide are formed of a same material.

(4). The solid-state imaging device according to (3), wherein the same material comprises at least one kind of material selected from a group consisting of $Si_3N_4$, $ZrO_2$, $TiO_2$, $CeO_2$, $HfO_2$, ZnO, MgO, AlN and GaN.

(5). The solid-state imaging device according to (3), wherein the same material is a high refractive index material having a refractive index of 1.8 or higher.

(6). The solid-state imaging device according to anyone of (1) to (5), wherein the device further comprises a transparent resin with which an upper part of the microlens is sealed.

(7). The solid-state imaging device according to (6), wherein the transparent resin is a low refractive index material having a refractive index of 1.6 or lower.

(8). The solid-state imaging device according to any one of (1) to (7), wherein the device further comprises an antireflection film on an upper surface of the on-chip microlens.

(9). The solid-state imaging device according to anyone of (1) to (8), wherein the device further comprises an antireflection film on end surface of the light-receiving part side of the optical waveguide.

(10). The solid-state imaging device according to any one of (1) to (9), wherein as a position of the on-chip microlens approaches a peripheral part of the solid-state imaging device, a center axis of the on-chip microlens is shifted toward a center part of the solid-state imaging device from an aperture center of the light-receiving part provided below the on-chip microlens.

(11). The solid-state imaging device according to (1) to (10), wherein the device comprises a low refractive index layer having a refractive index lower than that of the optical waveguide on a side wall of the optical waveguide.

(12). The solid-state imaging device according to (1) to (11), wherein the device further comprises a light shielding film in a cylindrical shape above the light-receiving part, and the incident light passing through the optical waveguide passes through an inside of the light shielding film and is incident on the light-receiving part.

(13). The solid-state imaging device according to (12), wherein the device further comprises a color filter layer filled in the inside the light shielding film.

(14). The solid-state imaging device according to any one of (1) to (11), wherein the on-chip microlens comprises a color filter layer thereon.

(15). The solid-state imaging device according to (12) or (13), wherein the light shielding film comprising at least one of aluminum, silver, gold, copper and tungsten. (16). The solid-state imaging device according to any one of (13) to (15), wherein the color filter layer comprises a pigment evaporated film.

(17). The solid-state imaging device according to any one of (13) to (16), wherein adjacent color filter layers are made different from each other in filter color.

(18). The solid-state imaging device according to any one of (13) to (17), wherein the color filter layer comprises a pigment.

(19). A manufacturing method of a color solid-state imaging device which comprises a photoelectric conversion device arranged on a substrate, and a color filter disposed on a microlens made of inorganic material and positioned in front of a light-receiving part of each of the photoelectric conversion device and in which adjacent ones of the respective color filters are disposed while their sides are substantially in contact with each other, the manufacturing method comprising the steps of:

forming a pigment evaporated film by evaporating a pigment material on the microlens;

forming a patterned photoresist layer on the pigment evaporated film;

forming a color filter of a first color by performing isotropic etching while using the photoresist layer as a mask to remove the pigment evaporated film exposed from the photoresist layer and to pattern the pigment evaporated film; and forming a color filter of a second color made of a pigment evaporated film of a second color at a place where the pigment evaporated film is removed.

According to one embodiment of the invention, it is possible to provide the solid-state imaging device in which the sensitivity of the light-receiving part is not reduced, the influence of the alignment shift or the optical path shift at a small F value or the like is reduced, and the incident light can be efficiently guided to the light-receiving part, and to provide the solid-state imaging device in which the thickness is thin and the cost is low.

DETAILED DESCRIPTION OF THE INVENTION

Hereinafter, embodiments of the invention will be described with reference to the drawings.

First Embodiment

Figure 1:
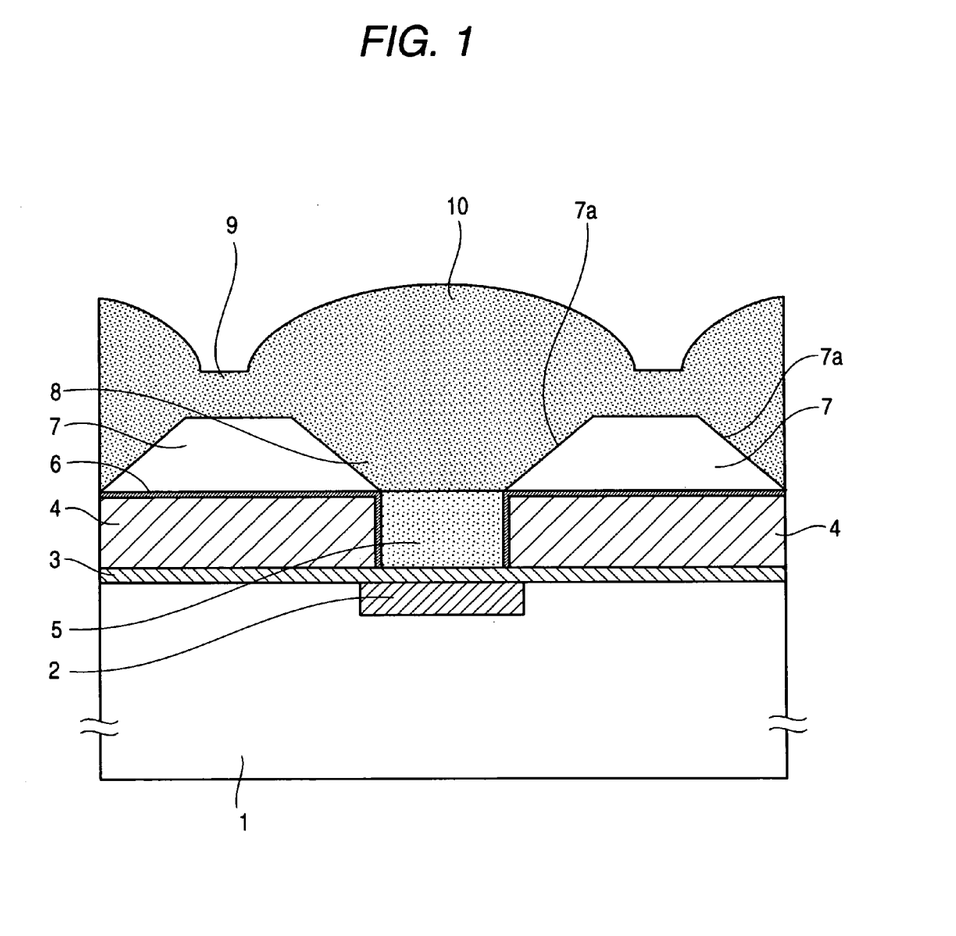
FIG. 1 is a sectional schematic view of a solid-state imaging device according to a first embodiment of the invention.

FIG. 1 is a sectional schematic view of a solid-state imaging device according to a first embodiment of the invention. In this solid-state imaging device, plural light-receiving parts (only one light-receiving part is shown) 2 are formed in the upper part of a semiconductor substrate 1, and a protection film 3 is formed on the whole surface of the semiconductor substrate 1. A single-layer or multi-layer insulating layer 4 is provided at positions except the respective light-receiving parts 2, and a not-shown wiring is provided in the insulating layer 4. Besides, a color filter layer 5 having the same thickness as the insulating layer 4 is provided on the light-receiving part 2.

A total reflection film made of a metal material is formed as a light shielding film 6 on an upper surface of the insulating layer 4 and a side surface thereof in contact with the color filter layer 5, and a low refractive index layer (since it is thin, its illustration is omitted) made of a low refractive index material such as $SiO_2$ is formed on an upper surface (including an interface to the color filter layer 5) of the light shielding film 6.

An insulating layer 7 made of a low refractive index material such as $SiO_2$ is laminated on an upper part (upper part of the light shielding film 6) of the insulating layer 4, and a hole 7a whose diameter is increased toward the upper part in a taper shape is provided in the insulating layer 7 and above the light-receiving part 2.

The inside of the taper-shaped hole 7a provided in the insulating layer 7 is filled with a transparent high refractive index material such as $Si_3N_4$, and this forms an optical waveguide 8. A planarizing layer 9 and an on-chip microlens 10 at an upper part are formed of the same material as the optical waveguide 8. That is, in this embodiment, the on-chip microlens 10, the planarizing layer 9, and the optical waveguide 8 are integrally formed of the same material. As the material, a high refractive index material with a refractive index of 1.8 or higher is preferable. The focal position of the microlens is set in the vicinity of the surface of the light-receiving part 2.

Incidentally, the planarizing layer 9 in this embodiment is not provided for planarization, and a region remaining between the microlens 10 and the optical waveguide 8 is merely called the planarizing layer 9, and accordingly, this portion may be removed.

As the high refractive index material, $TiO_2$, $HfO_2$, $ZrO_2$, $CeO_2$, AlN, GaN or the like can also be used in addition to $Si_3N_4$.

Figure 2A:
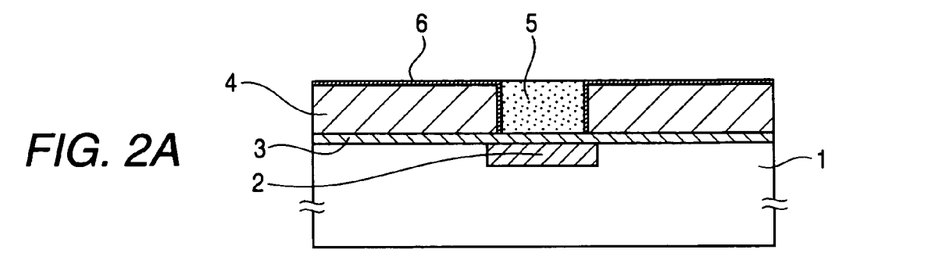
FIGS. 2A to 2D are views showing a general manufacturing process of the solid-state imaging device shown in FIG. 1.

FIGS. 2A to 2D are views showing a general manufacturing process of the solid-state imaging device shown in FIG. 1. First, as shown in FIG. 2A, a protection film 3 made of an oxide or the like is formed on a semiconductor substrate 1 in which plural light-receiving parts 2 are formed, and an insulating layer 4 is formed on the whole surface of the upper part.

Next, after a resist film is formed on the whole surface, a mask pattern is formed using a photolithography method so that an opening is made at last at a part of the insulating layer 4 above the light-receiving part 2. Thereafter, etching is performed anisotropically by using an RIE method or the like to remove a portion of the insulating layer 4 under the opening, and a hole for a color filter 5 is formed.

Subsequently, a metal thin film 6 excellent in uniformity of film thickness and coatability is formed by a low temperature CVD method, a plasma CVD method, a sputtering method or the like. As this metal thin film, aluminum (Al), silver (Ag), gold (Au), copper (Cu), tungsten (W) or alloy of these, each of which has a high refractive index, can be used.

Thereafter, after a thin low refractive index layer made of a low refractive index material such as $SiO_2$ is formed on the whole surface, only the metal thin film and the $SiO_2$ above the light-receiving part 2 is removed by the RIE method or the like. Then, the resist film (mask pattern) is removed, and a color filter material having selective transparency to R, G, B or the like is filled in the inside of the hole for the color filter 5.

Figure 2B:
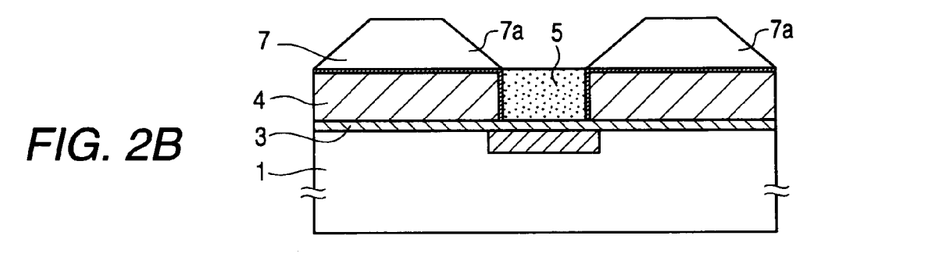

Next, as shown in FIG. 2B, an insulating film 7 is formed by a low temperature CVD method, a resist is coated, a gray-scale mask is used, and a conical pattern whose inner diameter becomes small toward the light-receiving part 2 is formed by a normal exposure method. Thereafter, dry etching is performed by RIE etching so as to transfer the shape of the resist, and a conical optical waveguide 7a whose inner diameter becomes small toward the light-receiving part 2 is formed in the insulating film ($SiO_2$) 7. A polygonal pyramid shape optical waveguide whose opening becomes small toward the light-receiving part may be formed.

Figure 2C:
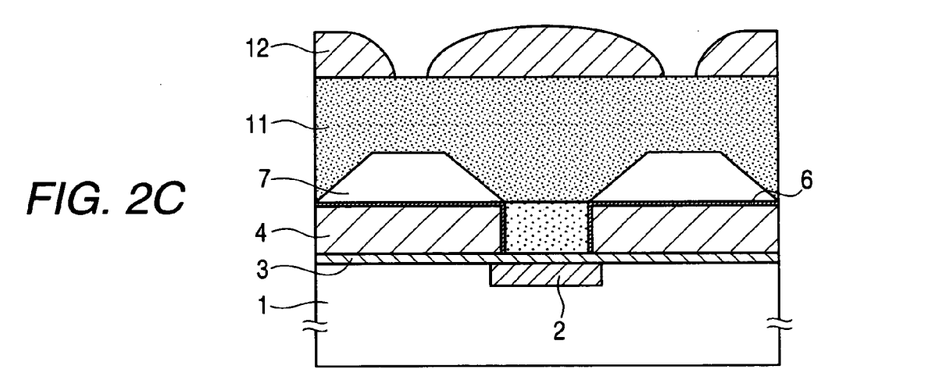

Next, as shown in FIG. 2C, after the resist is removed, a high refractive index material (for example, $Si_3N_4$) layer 11 is formed by the low temperature CVD. The upper end surface of the high refractive index material layer 11 is subjected to a planarizing process, and subsequently, an on-chip microlens pattern 12 in which a parameter value is set so that the focal point is in the vicinity of the surface of the light-receiving part 2, is formed on the high refractive index material layer 11 by using a thermosoftening resin or the like.

Figure 2D:
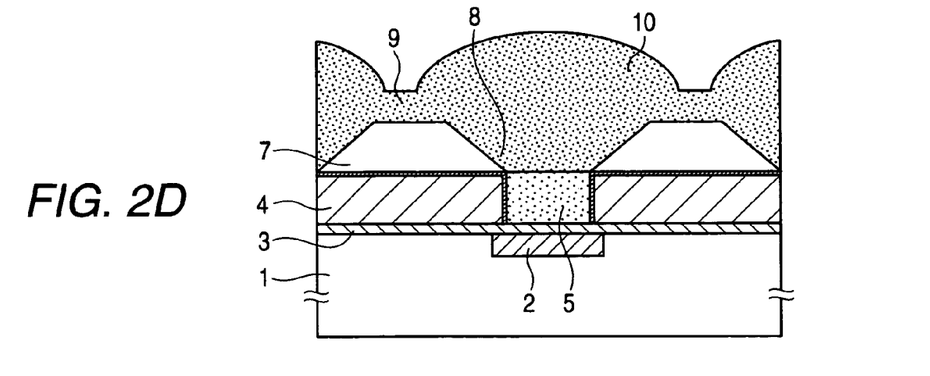

Next, as shown in FIG. 2D (this drawing is the same as FIG. 1), when etching is performed from the upper surface until all the on-chip microlens pattern 12 is removed, the shape of the on-chip microlens pattern 12 is transferred to the lower high refractive index material layer 11, and an on-chip microlens 10, a planarizing layer 9 as a lower part thereof, and an optical waveguide 8 are integrally formed.

Incidentally, in this embodiment, the high refractive index material layer 11 is provided, and this is etched to integrally form the microlens 10, the planarizing layer 9 and the optical waveguide 8. However, these may be integrally formed in such a manner that the optical waveguide 8 is first formed of a high refractive index material, the planarizing layer 9 is formed thereon by using the high refractive index material (this planarizing layer 9 may not be provided as described before), and the microlens 10 is further formed thereon by using the high refractive index material.

Second Embodiment

Figure 3:
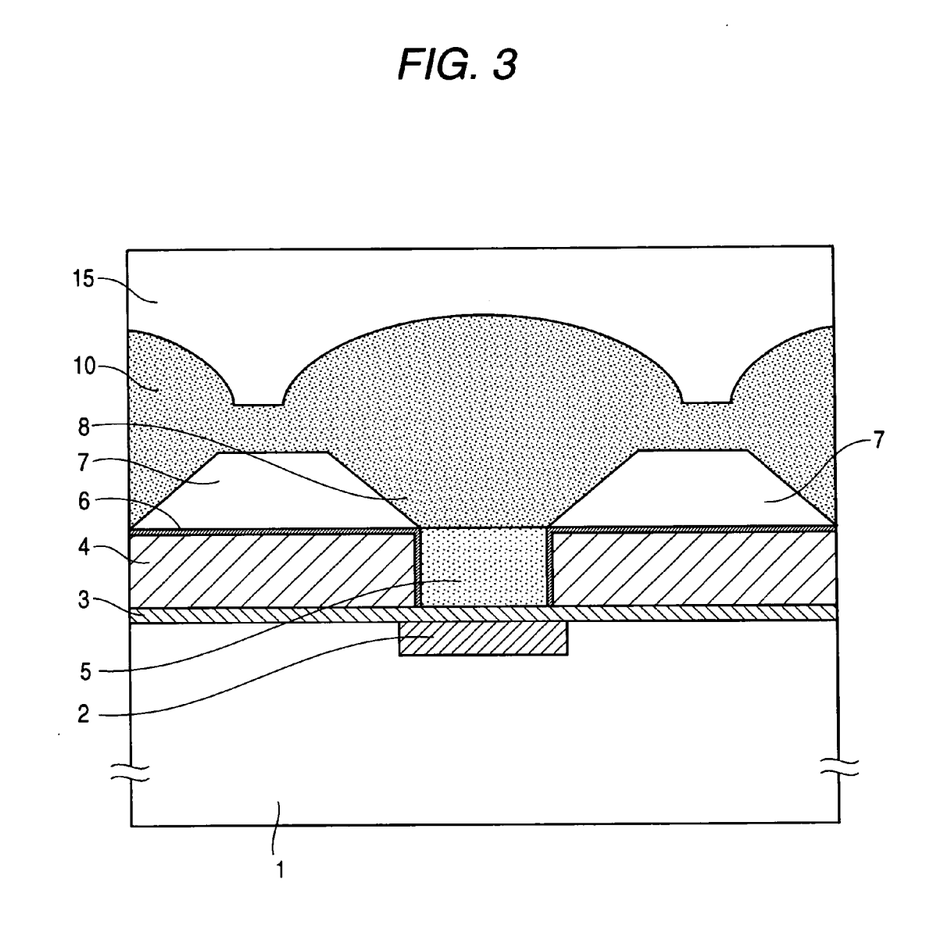
FIG. 3 is a sectional schematic view of a solid-state imaging device according to a second embodiment of the invention.

FIG. 3 is a sectional schematic view of a solid-state imaging device according to a second embodiment of the invention. A difference from the solid-state imaging device of the first embodiment shown in FIG. 1 is that an optical transparent resin layer 15 is provided on a microlens 10, the microlens 10 is embedded in the resin layer 15, and planarization is performed. It is preferable that the resin layer 15 is made of a low refractive index material with a refractive index of 1.6 or lower.

Third Embodiment

Figure 4:
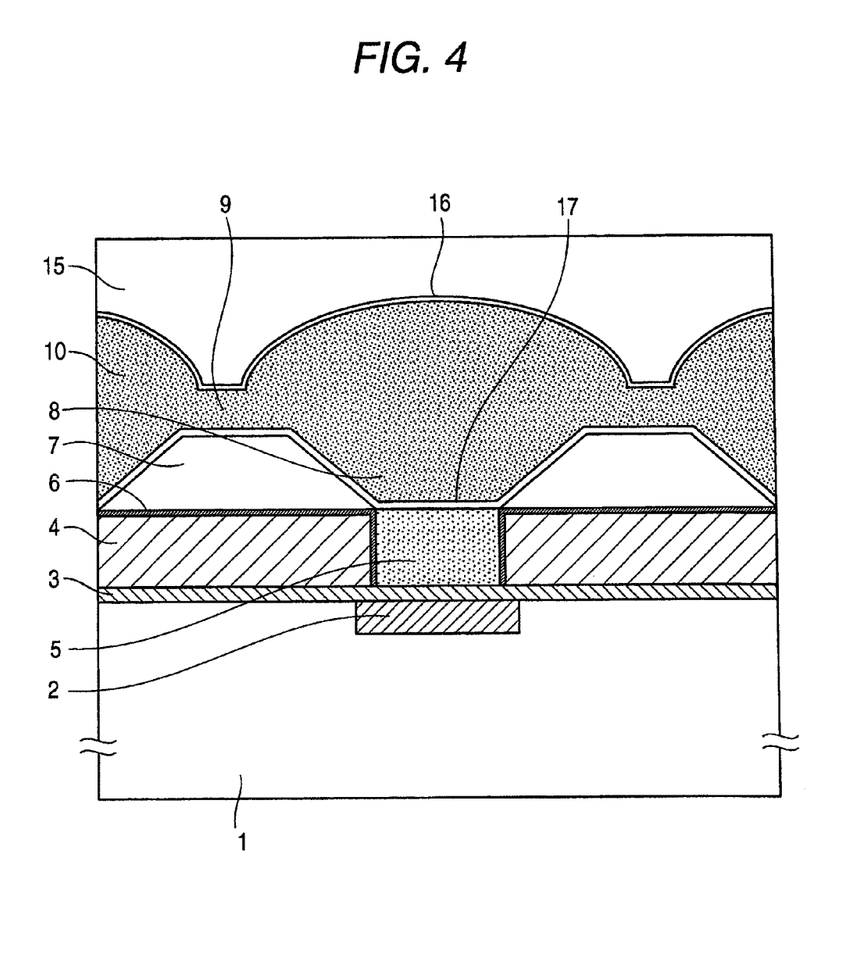
FIG. 4 is a sectional schematic view of a solid-state imaging device according to a third embodiment of the invention.

FIG. 4 is a sectional schematic view of a solid-state imaging device according to a third embodiment. A difference between the solid-state imaging device of this embodiment and the solid-state imaging device shown in FIG. 3 is that an AR coat (Anti-Reflective Coat) film 16 is provided on the whole upper surface of a microlens 10, and an AR coat film 17 is provided at the lower surface of an optical waveguide 8. By this, reflected light at an interface between a resin layer 15 and the microlens 10, and at an interface between a color filter 5 and the optical waveguide 8 can be reduced, and the incidence efficiency of light to a light-receiving part 2 can be raised. Incidentally, it is appropriate that a film for antireflection is formed also on the lower end surface of the color filter 5.

Fourth Embodiment

Figure 5:
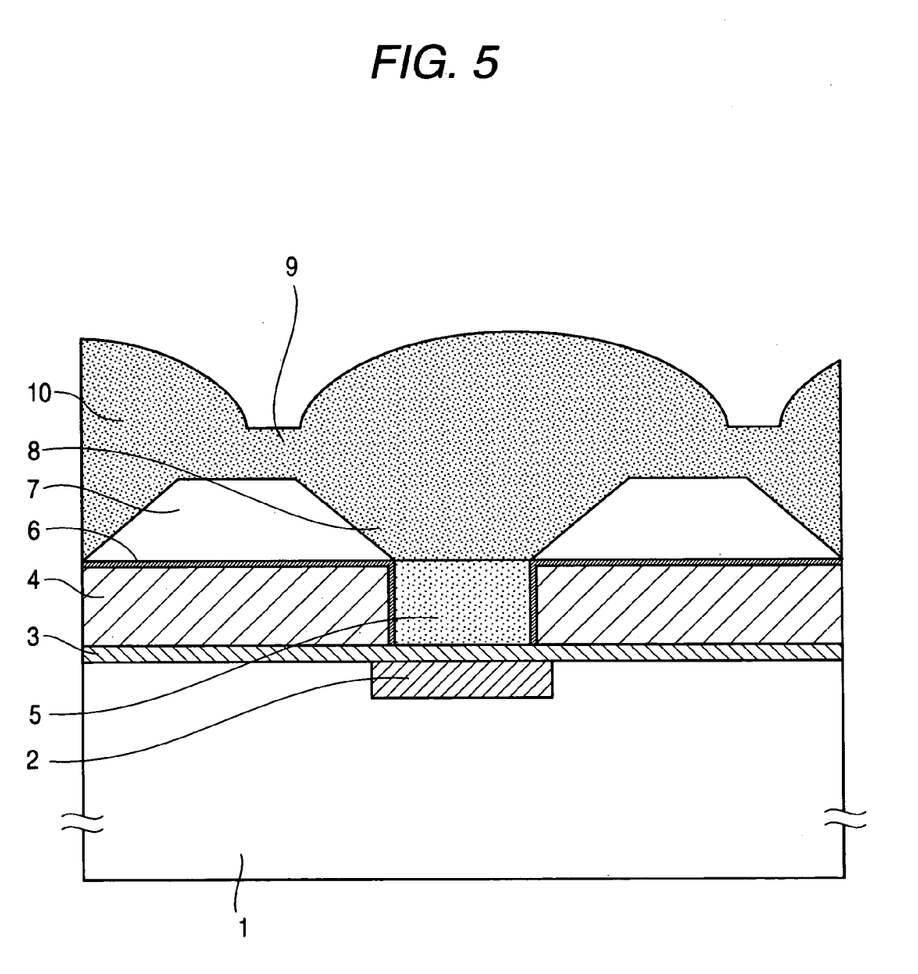
FIG. 5 is a sectional schematic view of a solid-state imaging device according to a fourth embodiment of the invention.

FIG. 5 is a sectional schematic view of a solid-state imaging device according to a fourth embodiment of the invention. A difference between the solid-state imaging device of this embodiment and the solid-state imaging device shown in FIG. 1 is that in the solid-state imaging device of this embodiment, as a position of an on-chip microlens approaches the peripheral part of the solid-state imaging device, a position of a center axis of a microlens 10 is shifted toward the center of the solid-state imaging device from an aperture center of a light-receiving part 2. By this, the light use efficiency in the peripheral part is improved.

According to the solid-state imaging device of the respective embodiments described above, basically, the incident light condensed by the microlens 10 is guided to the light-receiving part 2 by the optical waveguide 8 integrally continuous with the microlens 10, and the sensitivity is improved. Even in the case where the alignment shift between the microlens 10 and the light-receiving part 2 occurs, or even in the case where the incident light angle is changed from the vertical direction with respect to the substrate 1 and oblique incidence occurs, since the light once entering the optical waveguide 8 is reflected by the side wall surface of the optical waveguide and is returned to the optical waveguide 8, the light loss hardly occurs, and it becomes possible to suppress a reduction in light intensity to the minimum.

Besides, the color filter 5 is embedded in the outlet portion of the optical waveguide 8, and the periphery of the color filter 5 is surrounded by the light shielding film 6 so that the color filter 5 itself is made the optical waveguide. Thus, the light passing through the color filter 5 does not leak to the adjacent light-receiving part 2, and accordingly, it becomes possible to avoid color mixture, to improve the sensitivity, and to improve color reproducibility. Further, since the microlens 10 is formed of the high refractive index material, light condensing efficiency is raised, and further, since the upper part of the microlens 10 can be sealed by resin, it becomes possible to reduce the thickness and to reduce the cost.

Furthermore, in general, although a shift of the focal position (chromatic aberration) occurs by the difference of the wavelength of incident light, according to the solid-state imaging device of this embodiment, by adjusting the thickness of the color filter material and the material, the focal points of all incident lights can be easily set in the vicinity of the surface of the light-receiving part 2. Further, as compared with the conventional structure in which the color filter material is set at the upper part of the insulating layer, the size in the height direction of the device can be reduced, and it is possible to realize a further improvement in sensitivity of the solid-state imaging device and a further improvement in color reproducibility.

Accordingly, it becomes possible to easily increase the number of pixels and to enhance the sensitivity of the solid-state imaging device used for a digital camera, a video camera, a facsimile, a scanner, a copying machine or the like, or the solid-state imaging device used for a biosensor or a chemical sensor.

Fifth Embodiment

Figure 6:
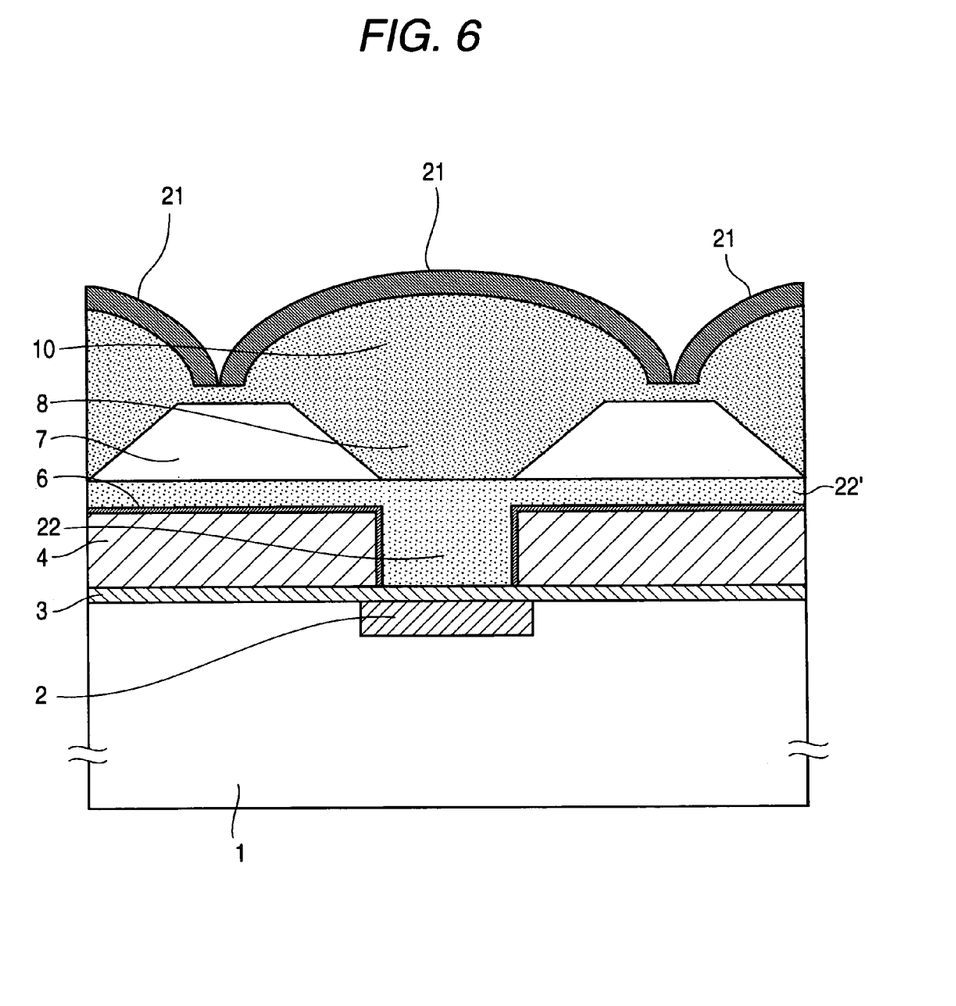
FIG. 6 is a sectional schematic view of a solid-state imaging device according to a fifth embodiment of the invention.

FIG. 6 is a sectional schematic view of a solid-state imaging device according to a fifth embodiment of the invention. The solid-state imaging device according to this embodiment is different from the solid-state imaging device according to the first embodiment of FIG. 1 only in the following points. First, a difference is that a color filter 21 is provided on an upper part of each of microlenses 10, and another difference is that by this, instead of the color filter 5 of FIG. 1, this portion is filled with a high refractive index material (which is preferably the same material as the microlens 10) to form an optical waveguide 22. In the optical waveguide 22, since the thickness of this portion is thin, it is not necessary to form a taper shape like an optical waveguide 8.

Figure 7A:
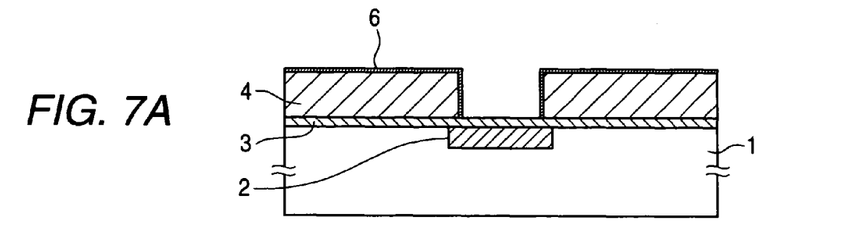
FIGS. 7A to 7D are views showing a general manufacturing process of the solid-state imaging device shown in FIG. 6.

FIGS. 7A to 7D are views for explaining a general manufacturing process of the solid-state imaging device of this embodiment. In the solid-state imaging device of this embodiment, similarly to FIG. 2A, a process is performed which is similar to a process performed before the material of the color filter 5 is filled in the hole above the light-receiving part 2, and a state of FIG. 7A is obtained.

Figure 7B:
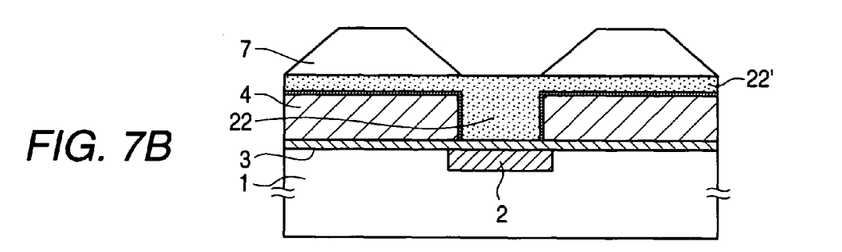

Next, as shown in FIG. 7B, a film of a high refractive index material, for example, $Si_3N_4$ is formed by a CVD method, and the hole above the light-receiving part 2 is filled to form an optical waveguide 22. At this time, since the thick $Si_3N_4$ film is formed in order to perform planarization of the film of the high refractive index material, a $Si_3N_4$ film 22' is formed also on the upper surface of the light shielding film 6, however, it is unnecessary to remove this film 22'.

Figure 7C:
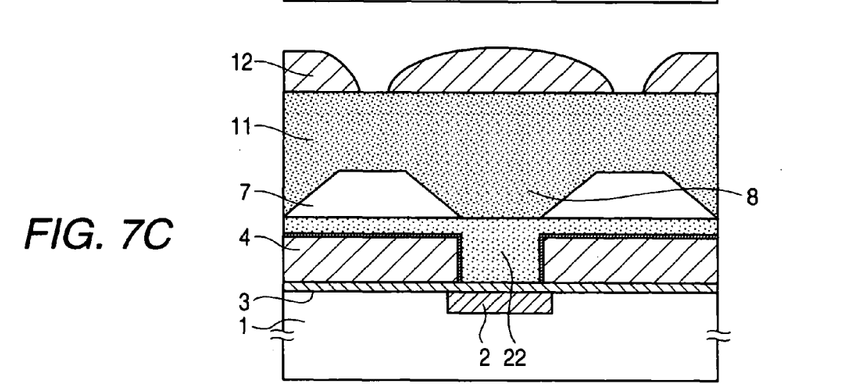

Subsequently, a formation step of an insulating layer 7 is similar to FIG. 2B. Next, as shown in FIG. 7C, a step of forming a thick high refractive index material layer 11 and forming an on-chip microlens pattern 12 thereon is similar to FIG. 2C, and etching is performed so that the on-chip microlens pattern 12 is transferred as a microlens 10.

Figure 7D:
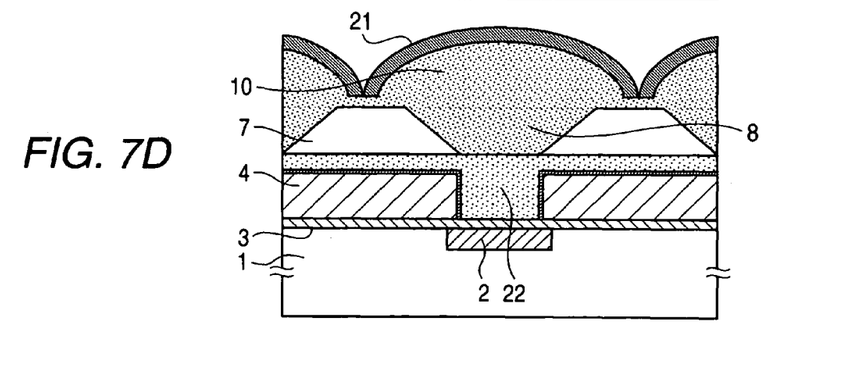

Next, as shown in FIG. 7D, a color filter material having selective transparency to R, G, B or the like is formed on each of the microlenses 10 by an evaporation method. Evaporation and lithography are performed so that adjacent color filters 21 have different filter colors. The color filter material on an unnecessary part is removed by low temperature ashing by oxygen gas while using a resist as a mask. Since the microlens 10 is formed of inorganic material, the etching is automatically stopped at the upper part of the microlens. As the process temperature, it is preferable to make the removal at a temperature of 100° C. or lower. The color filter 21 may be formed by an evaporation method of organic pigment.

Sixth Embodiment

Figure 8:
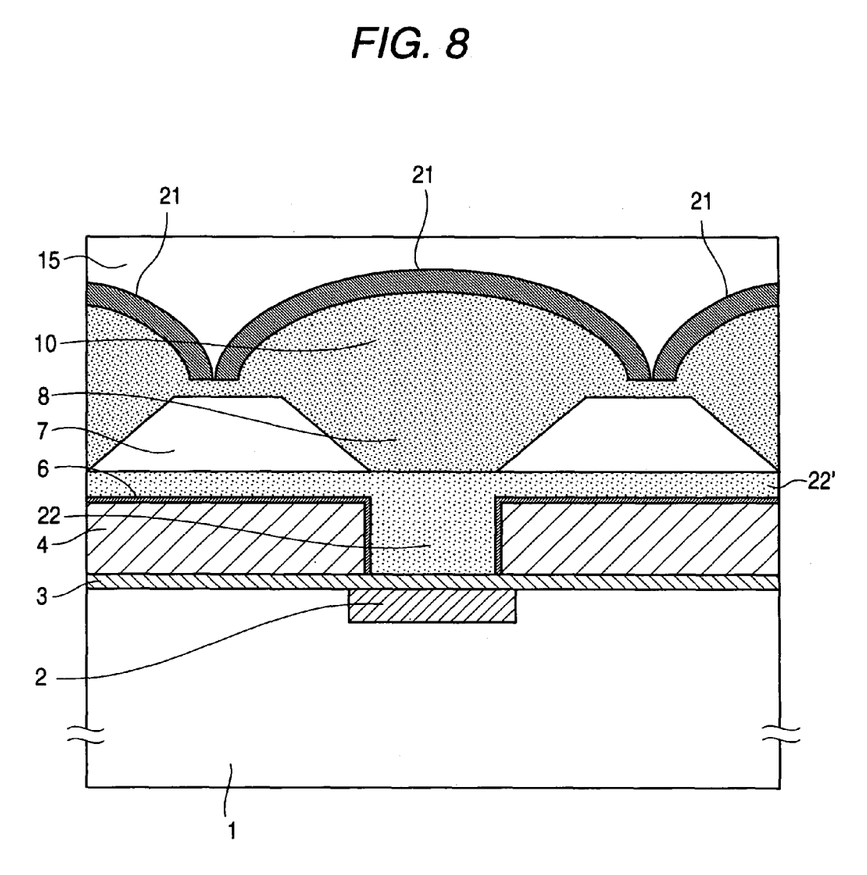
FIG. 8 is a sectional schematic view of a solid-state imaging device according to a sixth embodiment of the invention.

FIG. 8 is a sectional schematic view of a solid-state imaging device according to a sixth embodiment of the invention. A difference from the solid-state imaging device of the fifth embodiment shown in FIG. 6 is that an optically transparent resin layer 15 with a refractive index of, preferably, 1.6 or lower is provided on the upper part of a microlens 10, the microlens 10 is embedded in the resin layer 15, and planarization is performed.

Seventh Embodiment

Figure 9:
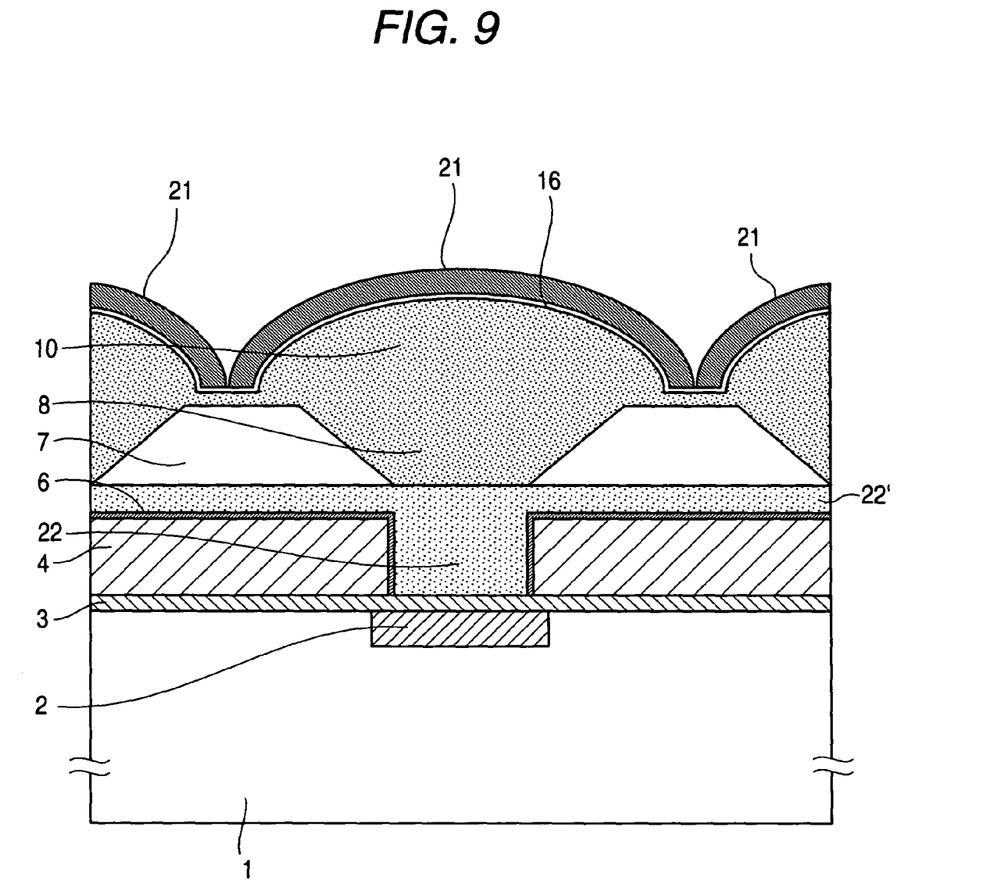
FIG. 9 is a sectional schematic view of a solid-state imaging device according to a seventh embodiment of the invention.

FIG. 9 is a sectional schematic view of a solid-state imaging device according to a seventh embodiment of the invention. A difference between the solid-state imaging device of this embodiment and the solid-state imaging device shown in FIG. 6 is that an AR coat (Anti-Reflective Coat) film 16 is provided on the whole upper surface of a microlens 10, and a color filter 21 is provided thereon. By this, reflected light at an interface between the color filter 21 and the microlens 10 can be reduced, and the incidence efficiency of light to a light-receiving part 2 can be raised. Incidentally, it is appropriate that a film for antireflection is formed also on the lower end surface of an optical waveguide 22.

Eighth Embodiment

Figure 10:
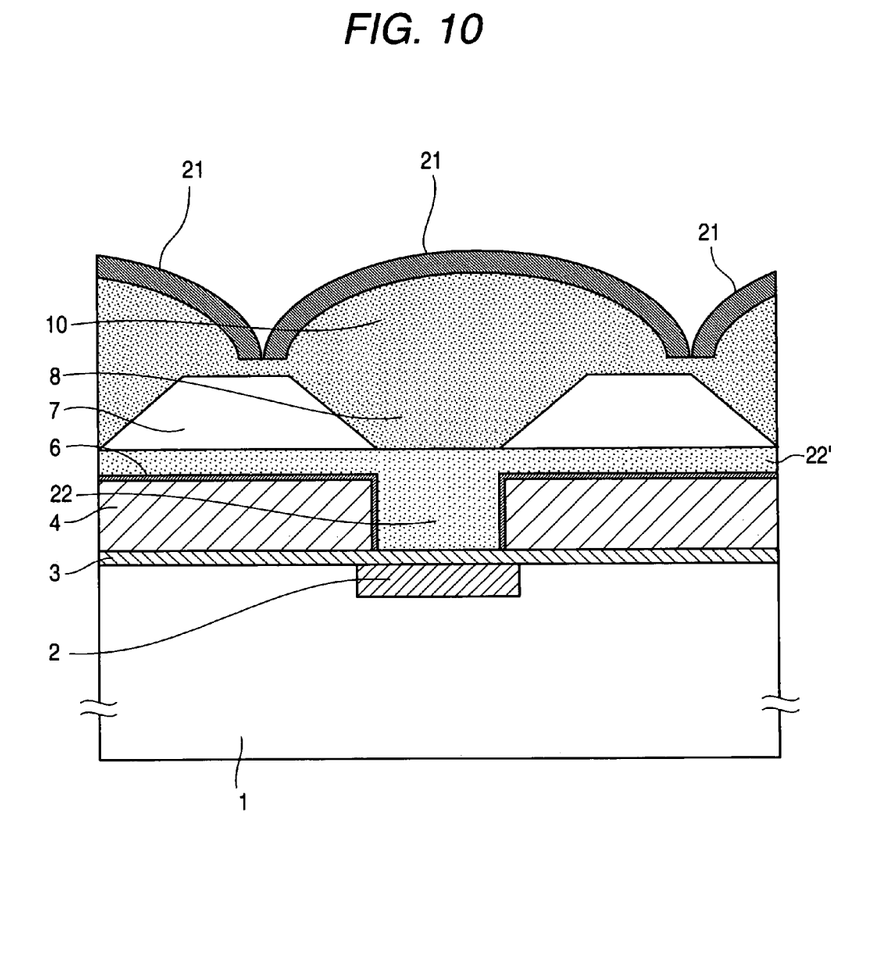
FIG. 10 is a sectional schematic view of a solid-state imaging device according to an eighth embodiment of the invention.

FIG. 10 is a sectional schematic view of a solid-state imaging device according to an eighth embodiment of the invention. A difference between the solid-state imaging device of this embodiment and the solid-state imaging device shown in FIG. 6 is that in the solid-state imaging device of this embodiment, a position of an on-chip microlens approaches a peripheral part of the solid-state imaging device, a position of a center axis of a microlens 10 is provided to be shifted from an aperture center of a light-receiving part 2. By this, the light use efficiency in the peripheral part is improved.

The solid-state imaging device of the fifth to eighth embodiments has the same effect as the solid-state imaging device of the first to fourth embodiments, and further, since the color filter 21 is provided on the upper surface of the microlens 10, the planarizing layer as in the related art does not exist between the microlens 10 and the color filter 21, and accordingly, the height of the upper layer part of the solid-state imaging device can be suppressed by that. Since the color filter 21 does not include a photosensitizer or curing agent like the related art, a reduction in thickness is possible, and consequently, the height of the upper layer part of the solid-state imaging device can be made low, oblique incident light is certainly condensed on the light-receiving part of the solid-state imaging device, and it becomes possible to obtain high light sensitivity also to the oblique incident light.

Incidentally, in the foregoing embodiments, although the microlens 10 is not shown as a gapless microlens, it is needless to say that the gapless microlens may be adopted.

Besides, it is also possible to form a solid-state imaging device in which the feature portions of the respective embodiments are combined. For example, it is a matter of course that the AR coat as the feature of the embodiment of FIG. 4 may be provided on the solid-state imaging device of the embodiment of FIG. 5.

In the solid-state imaging device of the invention, even if a reduction in the size of one pixel is advanced by the increase in the number of pixels, an improvement in high sensitivity can be realized, and accordingly, it is useful as an image sensor such as a CCD or a CMOS.

What is claimed is:
1. A solid-state imaging device, comprising:
   an on-chip microlens;
   a light-receiving part that receives incident light condensed by the on-chip microlens; and
   an optical waveguide that extends from an undersurface part of the on-chip microlens toward the light-receiving part, and guides the incident light condensed by the on-chip microlens to the light-receiving part, wherein the optical waveguide is in contact with and integrated with the on-chip microlens, and wherein the on-chip microlens and the optical waveguide are formed of a same material;

wherein the device further comprises a light shielding film in a cylindrical shape above the light-receiving part, and the incident light passing through the optical waveguide passes through an inside of the a cylinder formed by the light shielding film and is incident on the light-receiving part;

wherein the device further comprises a color filter layer filled in the inside of the light shielding film between the optical waveguide and the light-receiving part, and a diameter of the optical waveguide is reduced toward the light-receiving part such that the optical waveguide has one of a conical shape and a polygonal pyramid shape.

2. The solid-state imaging device according to claim 1, wherein the same material comprises at least one kind of material selected from a group consisting of $Si_3N_4$, $ZrO_2$, $TiO_2$, $CeO_2$, $HfO_2$, ZnO, MgO, AlN and GaN.

3. The solid-state imaging device according to claim 1, wherein the same material is a high refractive index material having a refractive index of 1.8 or higher.

4. The solid-state imaging device according to claim 1, wherein the device further comprises a transparent resin with which an upper part of the on-chip microlens is sealed.

5. The solid-state imaging device according to claim 4, wherein the transparent resin is a low refractive index material having a refractive index of 1.6 or lower.

6. The solid-state imaging device according to claim 1, wherein the device further comprises an antireflection film on an upper surface of the on-chip microlens.

7. The solid-state imaging device according to claim 1, wherein the device further comprises an antireflection film on end surface of the light-receiving part side of the optical waveguide.

8. The solid-state imaging device according to claim 1, wherein the device comprises a low-refractive index layer having a refractive index lower than a refractive index of the optical waveguide on a side wall of the optical waveguide.

9. The solid-state imaging device according to claim 1, wherein the light shielding film comprises at least one of aluminum, silver, gold, copper and tungsten.

10. The solid-state imaging device according to claim 1, wherein the color filter layer comprises a pigment evaporated film.

11. The solid-state imaging device according to claim 1, wherein adjacent color filter layers are made different from each other in filter color.

12. The solid-state imaging device according to claim 1, wherein the color filter layer comprises a pigment.

13. The solid-state imaging device according to claim 1, wherein the on-chip microlens is convex.

14. The solid-state imaging device according to claim 1, further comprising a protection film between the color filter layer and the light-receiving part.

* * * * *